United States Patent
Chung et al.

(10) Patent No.: US 12,183,499 B2
(45) Date of Patent: Dec. 31, 2024

(54) STRUCTURE FOR FORMING A 3D-COIL TRANSPONDER

(71) Applicant: CYNTEC CO., LTD., Hsinchu (TW)

(72) Inventors: Min-Feng Chung, Taichung (TW); Kuan Yu Chiu, Miaoli County (TW); Ching Hsiang Yu, New Taipei (TW)

(73) Assignee: CYNTEC CO., LTD., Hsinchu (TW)

( * ) Notice: Subject to any disclaimer, the term of this patent is extended or adjusted under 35 U.S.C. 154(b) by 837 days.

(21) Appl. No.: 17/317,904

(22) Filed: May 12, 2021

(65) Prior Publication Data
US 2022/0157512 A1 May 19, 2022

Related U.S. Application Data

(60) Provisional application No. 63/113,815, filed on Nov. 13, 2020.

(51) Int. Cl.
| | | |
|---|---|---|
| *H01Q 7/06* | (2006.01) | |
| *H01F 27/24* | (2006.01) | |
| *H01F 27/28* | (2006.01) | |
| *H01F 27/32* | (2006.01) | |
| *H01F 41/04* | (2006.01) | |
| *H01Q 7/08* | (2006.01) | |
| *H02J 7/00* | (2006.01) | |
| *H02J 50/10* | (2016.01) | |
| *H02J 50/70* | (2016.01) | |
| *H05K 7/20* | (2006.01) | |
| *H10N 10/00* | (2023.01) | |

(52) U.S. Cl.
CPC ......... *H01F 27/2823* (2013.01); *H01F 27/24* (2013.01); *H01F 27/32* (2013.01); *H01F 41/04* (2013.01); *H01Q 7/06* (2013.01); *H01Q 7/08* (2013.01); *H02J 7/0044* (2013.01); *H02J 50/10* (2016.02); *H02J 50/70* (2016.02); *H05K 7/20145* (2013.01); *H10N 10/00* (2023.02)

(58) Field of Classification Search
CPC .................................. H01Q 7/06; H01Q 7/08
See application file for complete search history.

(56) References Cited

FOREIGN PATENT DOCUMENTS

EP 2911244 A1 * 8/2015 ............... H01Q 1/12

* cited by examiner

*Primary Examiner* — Hoang V Nguyen
(74) *Attorney, Agent, or Firm* — Min-Lee Teng

(57) ABSTRACT

A structure for forming a 3D-coil transponder, wherein each group of leads is encapsulated by a separated insulating molding body and a magnetic body disposed over the plurality of separated groups of leads, wherein each said insulating molding body does not extend across two or more groups of leads.

20 Claims, 6 Drawing Sheets

S401 forming a plurality of separated groups of leads, wherein each group of leads are encapsulated by a separated insulating molding body S402 disposing a magnetic body over the plurality of separated groups of leads, wherein each said insulating molding body does not extend across two or more groups of leads that are located below the magnetic body

FIG. 4

STRUCTURE FOR FORMING A 3D-COIL TRANSPONDER

CROSS-REFERENCE TO RELATED APPLICATIONS

The present application claims the benefit of U.S. Provisional Application Ser. No. 63/113,815 filed on Nov. 13, 2020, the entirety of which is incorporated by reference herein.

BACKGROUND OF THE INVENTION

Field of the Invention

The invention relates to a 3D-coil transponder.

Description of the Related Art

Conventional structure of a 3D-coil transponder has a plastic thickness at the bottom of the magnetic body of the 3D-coil transponder, which can make the wire length for forming a coil surrounding the magnetic body longer. In addition, the longer wire will increase the loss and the size of the 3D-coil transponder.

Accordingly, there is demand for a better stacked electronic structure to solve the aforementioned problems.

SUMMARY OF THE INVENTION

One objective of the present invention is to provide a structure of a 3D-coil transponder that has no plastic thickness at the bottom of the magnetic body of the 3D-coil transponder, so as to make the wire length for forming a coil surrounding the magnetic body shorter, thereby reducing the loss and the size of the 3D-coil transponder.

In one embodiment, a structure for forming a 3D-coil transponder is disclosed, a the structure comprising: a plurality of separated groups of leads, wherein each group of leads are encapsulated by a separated insulating molding body; and a magnetic body, disposed over the plurality of separated groups of leads, wherein each said insulating molding body does not extend across two or more groups of leads that are located below the magnetic body.

In one embodiment, a first coil is disposed on the magnetic body and wounds around a X axis, wherein the first coil is formed by a first insulated wire that is in contact with the magnetic body.

In one embodiment, a second coil is disposed on the magnetic body and wounds around a Y axis, wherein the second coil is formed by a second insulated wire that is in contact with the magnetic body.

In one embodiment, a third coil is disposed on the magnetic body and wounds around a Z axis, wherein the third coil is formed by a third insulated wire that is in contact with the magnetic body.

In one embodiment, a protection layer is disposed on the magnetic body, wherein a first coil is disposed on the protection layer and wounds around a X axis, wherein the first coil is formed by a first insulated wire that is in contact with the protection layer.

In one embodiment, a protection layer is disposed on the magnetic body, wherein a second coil is disposed on the protection layer and wounds around a Y axis, wherein the second coil is formed by a second insulated wire that is in contact with the protection layer.

In one embodiment, a protection layer is disposed on the magnetic body, wherein a third coil is disposed on the protection layer and wounds around a Z axis, wherein the third coil is formed by a third insulated wire that is in contact with the protection layer.

In one embodiment, the magnetic body comprises ferrite.

In one embodiment, the first insulated wire is made by an enameled wire.

In one embodiment, each separated insulating molding body is made by injection molding.

In one embodiment, each group of leads consists of two leads, wherein a portion of each lead is exposed from its corresponding insulating molding body for forming a surface-mounted PAD.

In one embodiment, wherein an end portion of the enameled wire is soldered to a portion of a corresponding lead, said portion is protruded on a lateral surface of a corresponding insulating molding body.

In one embodiment, a method to form a structure for forming a 3D-coil transponder is disclosed, the method comprising: forming a plurality of separated groups of leads, wherein each group of leads are encapsulated by a separated insulating molding body; and disposing a magnetic body over the plurality of separated groups of leads, wherein each said insulating molding body does not extend across two or more groups of leads that are located below the magnetic body.

In one embodiment, a first coil is disposed on the magnetic body and wounds around a X axis, wherein the first coil is formed by a first insulated wire that is in contact with the magnetic body.

In one embodiment, a second coil is disposed on the magnetic body and wounds around a Y axis, wherein the second coil is formed by a second insulated wire that is in contact with the magnetic body.

In one embodiment, a third coil is disposed on the magnetic body and wounds around a Z axis, wherein the third coil is formed by a third insulated wire that is in contact with the magnetic body.

In one embodiment, a protection layer is disposed on the magnetic body, wherein a first coil is disposed on the protection layer and wounds around a X axis, wherein the first coil is formed by a first insulated wire that is in contact with the protection layer.

In one embodiment, a protection layer is disposed on the magnetic body, wherein a second coil is disposed on the protection layer and wounds around a Y axis, wherein the second coil is formed by a second insulated wire that is in contact with the protection layer.

In one embodiment, a protection layer is disposed on the magnetic body, wherein a third coil is disposed on the protection layer and wounds around a Z axis, wherein the third coil is formed by a third insulated wire that is in contact with the protection layer.

In one embodiment, the magnetic body comprises ferrite.

In one embodiment, the first insulated wire is made by an enameled wire.

In one embodiment, each separated insulating molding body is made by injection molding.

BRIEF DESCRIPTION OF THE DRAWINGS

The present invention can be more fully understood by reading the subsequent description and examples with references made to the accompanying drawings, wherein:

FIG. 4 illustrates a method for forming a 3D-coil transponder in accordance with an embodiment of the invention.

DETAILED DESCRIPTION OF THE INVENTION

Figure 1A:
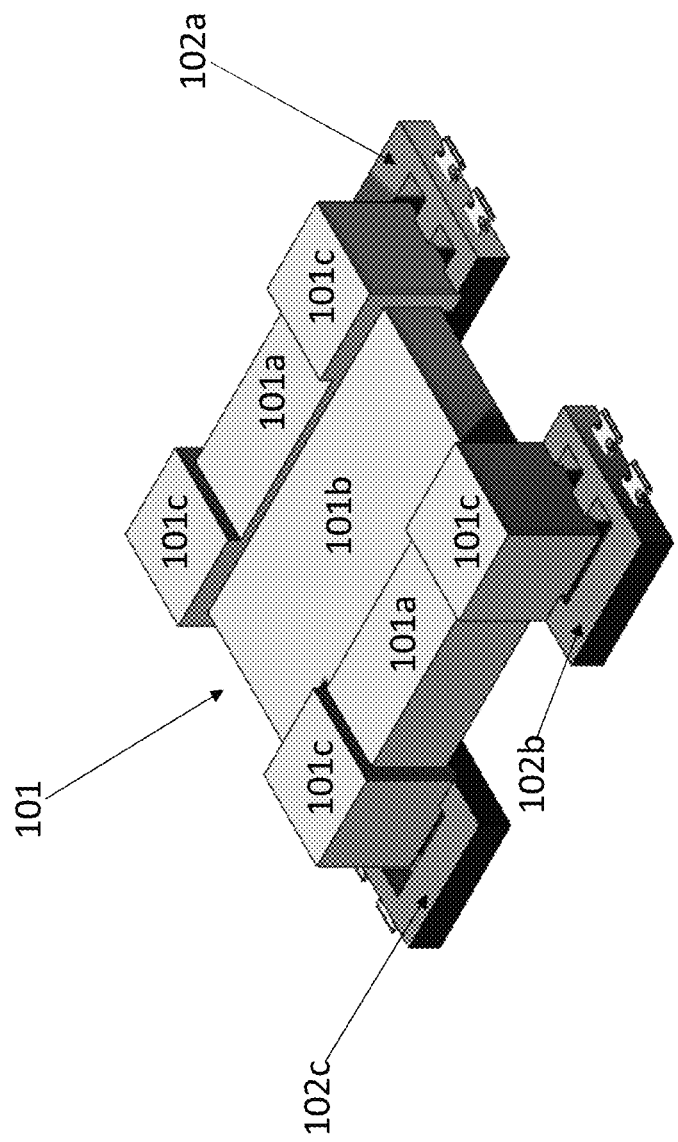
FIG. 1A illustrates a top view of a structure for forming a 3D-coil transponder in accordance with an embodiment of the invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1B:
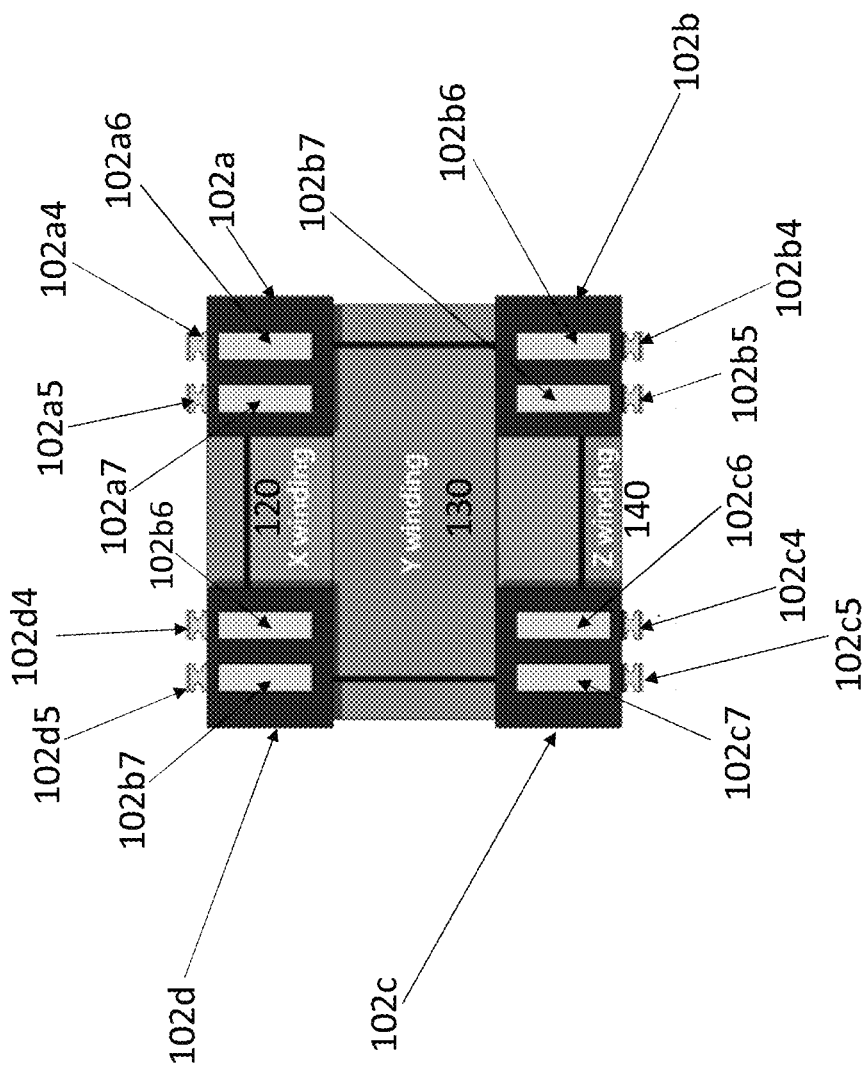
FIG. 1B illustrates a top view of a structure for forming a 3D-coil transponder in accordance with an embodiment of the invention.

FIG. 1A is a top view of a structure for forming a 3D-coil transponder in accordance with an embodiment of the invention; FIG. 1B is a bottom view of the structure for forming a 3D-coil transponder in accordance with an embodiment of the invention. Please refer to FIG. 1A and FIG. 1B, wherein the structure for forming a 3D-coil transponder comprises: a plurality of separated groups of leads 102a6, 102a7, 102b6, 102b7, 102c6, 102c7, 102d6, 102d7 with a portion of each lead is exposed from its corresponding insulating molding body, as shown in FIG. 1B, wherein each group of leads are encapsulated by a separated insulating molding body 102a, 102b, 102c, 102d, as shown in FIG. 1B; and a magnetic body 101, disposed over the plurality of separated groups of leads 102a6, 102a7, 102b6, 102b7, 102c6, 102c7, 102d6, 102d7, as shown in FIG. 1A, wherein each said insulating molding body 102a, 102b, 102c, 102d does not extend across two or more groups of leads that are located below the magnetic body 101, as shown in FIG. 1B. In one embodiment, the portion of each lead exposed from its corresponding insulating molding body forms a surface-mounted PAD, as shown in FIG. 1B.

In one embodiment, a first coil 120 is disposed on the magnetic body 101 and wounds around a X axis, wherein the first coil 120 is formed by a first insulated wire that is in contact with the magnetic body 101.

In one embodiment, a second coil 130 is disposed on the magnetic body 101 and wounds around a Y axis, wherein the second coil 130 is formed by a second insulated wire that is in contact with the magnetic body 101.

In one embodiment, a third coil 140 is disposed on the magnetic body 101 and wounds around a Z axis, wherein the third coil 140 is formed by a third insulated wire that is in contact with the magnetic body 140.

In one embodiment, the magnetic body 101 comprises a magnetic core and a protection layer disposed on the magnetic core, wherein a first coil 120 is disposed on the protection layer and wounds around a X axis, wherein the first coil 120 is formed by a first insulated wire that is in contact with the protection layer.

In one embodiment, the magnetic body 101 comprises a magnetic core and a protection layer disposed on the magnetic core, wherein a second coil 130 is disposed on the protection layer and wounds around a Y axis, wherein the second coil 130 is formed by a second insulated wire that is in contact with the protection layer.

In one embodiment, the magnetic body 101 comprises a magnetic core and a protection layer disposed on the magnetic core, wherein a third coil 140 is disposed on the protection layer and wounds around a Z axis, wherein the third coil 140 is formed by a third insulated wire that is in contact with the protection layer.

In one embodiment, the magnetic body comprises ferrite.

In one embodiment, the first insulated wire forming the first coil 120 is an enameled wire.

In one embodiment, the second insulated wire forming the second coil 130 is an enameled wire.

In one embodiment, the third insulated wire forming the third coil 140 is an enameled wire.

In one embodiment, each separated insulating molding body 102a, 102b, 102c, 102d is made by injection molding.

Figure 1C:
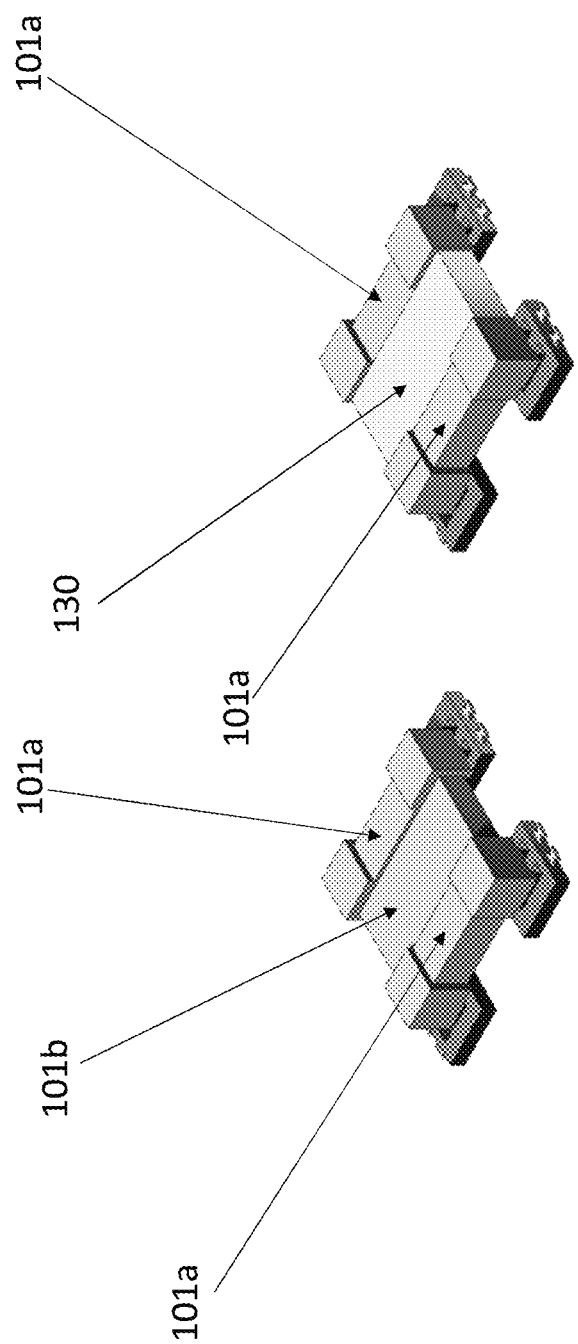
FIG. 1C illustrates a top view of a structure with a coil winding around an axis in accordance with an embodiment of the invention.

FIG. 1C is a top view of a structure with a coil 130 winding on a portion 130b of the magnetic body around a Y axis, in accordance with an embodiment of the invention, wherein the coil 130 can be in contact with a bottom surface of the portion 130b to reduce the length of the coil.

Figure 2:
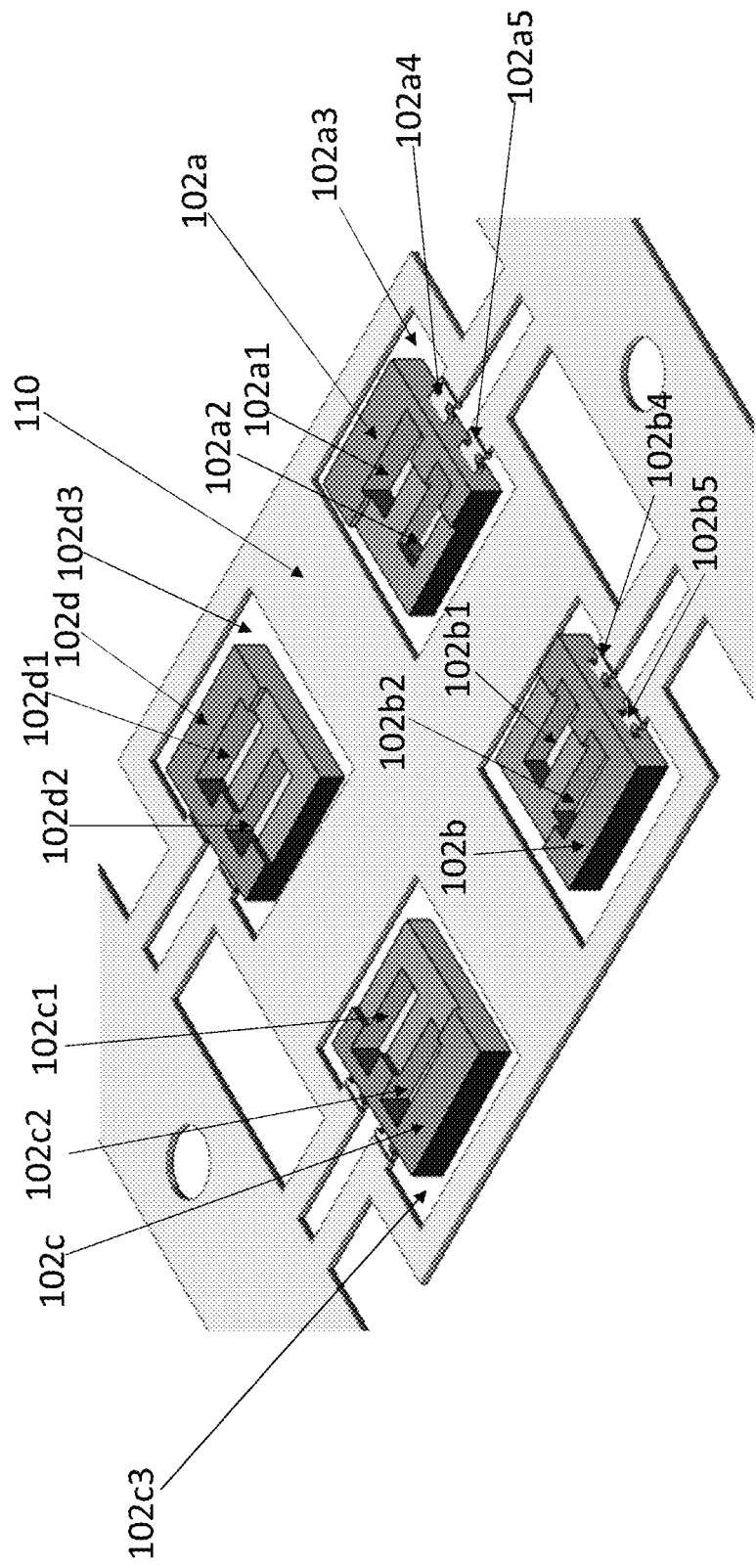
FIG. 2 illustrates a top view of a structure of a lead frame and an insulating molding body disposed in the lead frame for forming a 3D-coil transponder in accordance with an embodiment of the invention.

FIG. 2 illustrates a top view of a structure of a lead frame and an insulating molding body embedded in the lead frame for forming a 3D-coil transponder in accordance with an embodiment of the invention, wherein the structure of a lead frame and an insulating molding body for forming a 3D-coil transponder comprises: a lead frame 110 having four through openings 102a3, 102b3, 102c3, 102d3, wherein each group of leads 102a4, 102a5, 102b4, 102b5, 102c4, 102c5, 102d4, 102d5 is encapsulated by a separated insulating molding body 102a, 102b, 102c, 102d, wherein each insulating molding body 102a, 102b, 102c, 102d disposed in the four through openings 102a3, 102b3, 102c3, 102d3 of the lead frame are separated. In one embodiment, each insulating molding body 102a, 102b, 102c, 102d respectively comprises two though openings 102a1, 102a2, 102b1, 102b2, 102c1, 102c2, 102d1, 102d2 for connecting with the magnetic body 101.

In one embodiment, an adhesive material is disposed in the though openings 102a1, 102a2, 102b1, 102b2, 102c1, 102c2, 102d1, 102d2 for adhering to the magnetic body 101.

In one embodiment, each group of leads 102a4, 102a5, 102b4, 102b5, 102c4, 102c5, 102d4, 102d5 is extended to a portion 102a6, 102a7, 102b6, 102b7, 102c6, 102c7, 102d6, 102d7 of the lead frame, as shown in FIG. 1B, under the magnetic body 101 for forming electrodes of the 3D-coil transponder. In one embodiment, each two leads 102a4, 102a5, 102b4, 102b5, 102c4, 102c5, 102d4, 102d5 are connected to a corresponding coil 120, 130, 140 of the 3D-coil transponder.

Figure 3B:
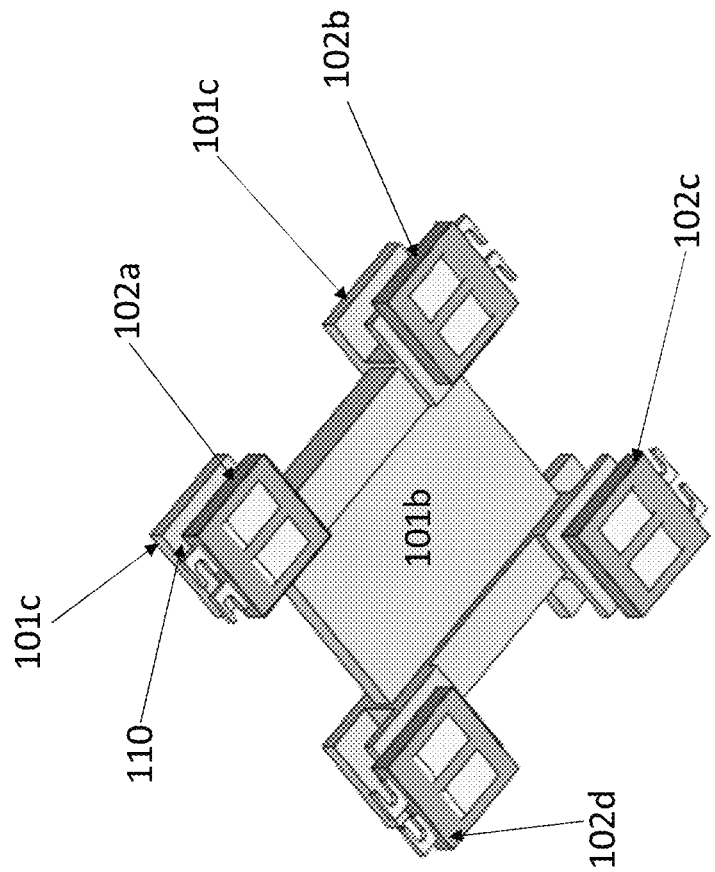
FIG. 3B illustrates a top view of a structure for forming a 3D-coil transponder in accordance with an embodiment of the invention.
Figure 3A:
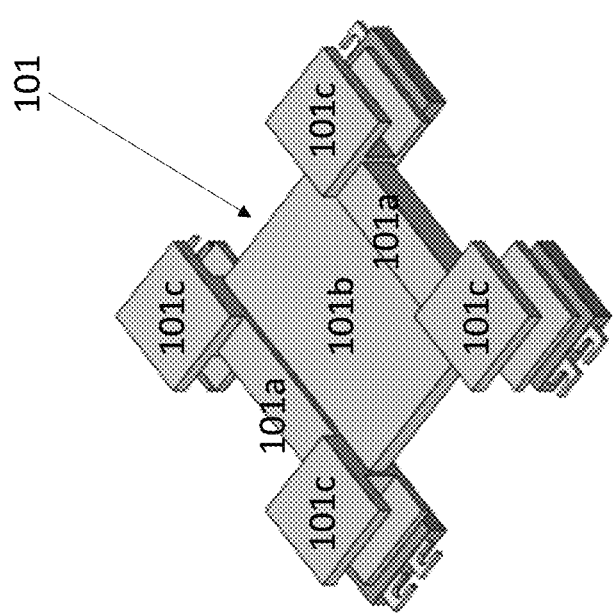
FIG. 3A illustrates a top view of a structure for forming a 3D-coil transponder in accordance with an embodiment of the invention.

FIG. 3A illustrates a top view of a structure for forming a 3D-coil transponder in accordance with an embodiment of the invention; FIG. 3B illustrates a top view of a structure for forming a 3D-coil transponder in accordance with an embodiment of the invention, wherein the magnetic body 101 comprises a portion 101c, wherein the portion 101c and the insulating molding body 102a forms a space 110 therebetween, wherein a portion of the coil winding around Z axis is disposed in the space 110.

In one embodiment, FIG. 4 shows a method to form a structure for forming a 3D-coil transponder, wherein the method comprises: step S401: forming a plurality of separated groups of leads, wherein each group of leads are encapsulated by a separated insulating molding body; and step S402: disposing a magnetic body over the plurality of separated groups of leads, wherein each said insulating molding body does not extend across two or more groups of leads that are located below the magnetic body.

In one embodiment, forming a plurality of separated groups of leads is by removing unwanted portion of a metal plate, wherein a portion of each of corresponding two leads are disposed under the magnetic body.

In one embodiment, a first coil is disposed on the magnetic body and wounds around a X axis, wherein the first coil is formed by a first insulated wire that is in contact with the magnetic body.

In one embodiment, a second coil is disposed on the magnetic body and wounds around a Y axis, wherein the second coil is formed by a second insulated wire that is in contact with the magnetic body.

In one embodiment, a third coil is disposed on the magnetic body and wounds around a Z axis, wherein the third coil is formed by a third insulated wire that is in contact with the magnetic body.

In one embodiment, a protection layer is disposed on the magnetic body, wherein a first coil is disposed on the protection layer and wounds around a X axis, wherein the first coil is formed by a first insulated wire that is in contact with the protection layer.

In one embodiment, a protection layer is disposed on the magnetic body, wherein a second coil is disposed on the protection layer and wounds around a Y axis, wherein the second coil is formed by a second insulated wire that is in contact with the protection layer.

In one embodiment, a protection layer is disposed on the magnetic body, wherein a third coil is disposed on the protection layer and wounds around a Z axis, wherein the third coil is formed by a third insulated wire that is in contact with the protection layer.

In one embodiment, the magnetic body comprises ferrite.

In one embodiment, the first insulated wire is made by an enameled wire.

In one embodiment, each separated insulating molding body is made by injection molding.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A structure for forming a 3D-coil transponder, comprising:
   a plurality of separated groups of leads, wherein each group of leads are encapsulated by a separated insulating molding body, wherein each group of leads consists of two leads and there are four separated insulating molding bodies; and
   a magnetic body, disposed over the plurality of separated groups of leads, wherein each said insulating molding body does not extend across two or more groups of leads.

2. The structure as claimed in claim 1, wherein a first coil is disposed on the magnetic body and wounds around a X axis, wherein the first coil is formed by a first insulated wire comprising a portion that is in contact with a bottom surface of the magnetic body.

3. The structure as claimed in claim 2, wherein the first insulated wire is made by an enameled wire, wherein an end portion of the enameled wire is connected to a portion of a corresponding lead, said portion is protruded on a lateral surface of a corresponding insulating molding body.

4. The structure as claimed in claim 1, wherein a second coil is disposed on the magnetic body and wounds around a Y axis, wherein the second coil is formed by a second insulated wire comprising a portion that is in contact with a bottom surface of the magnetic body.

5. The structure as claimed in claim 1, wherein a third coil is disposed on the magnetic body and wounds around a Z axis, wherein the third coil is formed by a third insulated wire that is in contact with the magnetic body.

6. The structure as claimed in claim 1, wherein a protection layer is disposed on the magnetic body, wherein a first coil is disposed on the protection layer and wounds around a X axis, wherein the first coil is formed by a first insulated wire comprising a portion that is in contact with a bottom surface of the protection layer.

7. The structure as claimed in claim 1, wherein a protection layer is disposed on the magnetic body, wherein a second coil is disposed on the protection layer and wounds around a Y axis, wherein the second coil is formed by a second insulated wire comprising a portion that is in contact with a bottom surface of the protection layer.

8. The structure as claimed in claim 1, wherein a protection layer is disposed on the magnetic body, wherein a third coil is disposed on the protection layer and wounds around a Z axis, wherein the third coil is formed by a third insulated wire that is in contact with the protection layer.

9. The structure as claimed in claim 1, wherein a portion of each lead is exposed from its corresponding insulating molding body for forming a surface-mounted PAD.

10. The structure as claimed in claim 1, wherein the magnetic body comprises a top portion, wherein the top portion and a corresponding insulating molding body forms a space therebetween, wherein a portion of a coil winding around Z axis is disposed in the space.

11. A method to form a structure for forming a 3D-coil transponder, the method comprising:
    forming a plurality of separated groups of leads, wherein each group of leads are encapsulated by a separated insulating molding body, wherein each group of leads consists of two leads and there are four separated insulating molding bodies; and
    disposing a magnetic body over the plurality of separated groups of leads, wherein each said insulating molding body does not extend across two or more groups of leads.

12. The method as claimed in claim 11, wherein a first coil is disposed on the magnetic body and wounds around a X axis, wherein the first coil is formed by a first insulated wire comprising a portion that is in contact with a bottom surface of the magnetic body.

13. The method as claimed in claim 12, wherein the first insulated wire is made by an enameled wire.

14. The method as claimed in claim 11, wherein a second coil is disposed on the magnetic body and wounds around a Y axis, wherein the second coil is formed by a second insulated wire comprising a portion that is in contact with a bottom surface of the magnetic body.

15. The method as claimed in claim 11, wherein a third coil is disposed on the magnetic body and wounds around a Z axis, wherein the third coil is formed by a third insulated wire that is in contact with the magnetic body.

16. The method as claimed in claim 11, wherein a protection layer is disposed on the magnetic body, wherein a first coil is disposed on the protection layer and wounds around a X axis, wherein the first coil is formed by a first insulated wire comprising a portion that is in contact with a bottom surface of the protection layer.

17. The method as claimed in claim 11, wherein a protection layer is disposed on the magnetic body, wherein a second coil is disposed on the protection layer and wounds around a Y axis, wherein the second coil is formed by a second insulated wire comprising a portion that is in contact with a bottom surface of the protection layer.

18. The method as claimed in claim 11, wherein a protection layer is disposed on the magnetic body, wherein a third coil is disposed on the protection layer and wounds around a Z axis, wherein the third coil is formed by a third insulated wire that is in contact with the protection layer.

19. The method as claimed in claim 11, wherein forming a plurality of separated groups of leads is by removing unwanted portion of a metal plate, wherein a portion of each of corresponding two leads are disposed under the magnetic body.

20. The method as claimed in claim 11, wherein each separated insulating molding body is made by injection molding, wherein each separated insulating molding comprises two through openings for connecting with the magnetic body.

\* \* \* \* \*